(12) United States Patent
Wong et al.

(10) Patent No.: US 10,585,464 B2
(45) Date of Patent: Mar. 10, 2020

(54) USER PROTECTION FROM THERMAL HOT SPOTS THROUGH DEVICE SKIN MORPHING

(71) Applicant: Intel Corporation, Santa Clara, CA (US)

(72) Inventors: Hong W. Wong, Portland, OR (US); Wah Yiu Kwong, Beaverton, OR (US); Cheong W. Wong, Beaverton, OR (US); Vivek M. Paranjape, Hillsboro, OR (US); Chia-Hung S. Kuo, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/089,029

(22) PCT Filed: Mar. 28, 2016

(86) PCT No.: PCT/US2016/024410
§ 371 (c)(1),
(2) Date: Sep. 27, 2018

(87) PCT Pub. No.: WO2017/171697
PCT Pub. Date: Oct. 5, 2017

(65) Prior Publication Data
US 2019/0121408 A1    Apr. 25, 2019

(51) Int. Cl.
*G06F 1/20*    (2006.01)
*H04M 1/02*    (2006.01)
(Continued)

(52) U.S. Cl.
CPC ............ *G06F 1/203* (2013.01); *G06F 1/1656* (2013.01); *G06F 1/206* (2013.01); *H04M 1/0202* (2013.01);
(Continued)

(58) Field of Classification Search
CPC .................................. G06F 1/203; G06F 1/206
See application file for complete search history.

(56) References Cited

U.S. PATENT DOCUMENTS

| 8,804,331 B2* | 8/2014 | Refai-Ahmed ..... H01L 23/3672 165/104.33 |
| 2008/0154159 A1* | 6/2008 | Kwong .................. G05D 23/08 601/20 |

(Continued)

OTHER PUBLICATIONS

International Search Report and Written Opinion for International Patent Application No. PCT/US2016/024410, dated Dec. 9, 2016, 12 pages.

(Continued)

*Primary Examiner* — Adrian S Wilson
(74) *Attorney, Agent, or Firm* — Jordan IP Law, LLC

(57) ABSTRACT

Systems, apparatuses and methods may provide for a thermal protection apparatus comprising a substrate including surfaces defining one or more channels and an array of openings adjacent to the one or more channels and an outer layer coupled to the substrate. The outer layer may include a plurality of opaque elastic regions positioned adjacent to the array of openings. Additionally, a fluid may be positioned within the one or more channels. In one example, the plurality of opaque elastic regions are expandable to become protrusions including one or more of a rectangular shape, a donut shape or a dome shape.

21 Claims, 4 Drawing Sheets

(51) Int. Cl.
*H05K 5/02* (2006.01)
*G06F 1/16* (2006.01)
*H05K 7/20* (2006.01)

(52) U.S. Cl.
CPC ....... *H05K 5/0213* (2013.01); *H05K 7/20327* (2013.01); *G06F 1/1626* (2013.01); *G06F 2200/201* (2013.01)

(56) References Cited

U.S. PATENT DOCUMENTS

| | | | |
|---|---|---|---|
| 2014/0158341 A1 | 6/2014 | Campbell et al. | |
| 2014/0318493 A1* | 10/2014 | Spix | F01M 1/08 123/196 R |
| 2015/0029658 A1* | 1/2015 | Yairi | G06F 1/20 361/679.47 |
| 2015/0205420 A1 | 7/2015 | Calub et al. | |
| 2015/0319889 A1* | 11/2015 | Flory | C09K 5/10 361/679.53 |
| 2016/0363970 A1* | 12/2016 | Zhou | G06F 1/20 |

OTHER PUBLICATIONS

Tactus, "Taking Touch Screen Interfaces Into a New Dimension", 2012, 13 pages, Tactus Technology Inc.
International Preliminary Report on Patentability for International Patent Application No. PCT/US2016/024410, dated Oct. 11, 2018, 9 pages.

\* cited by examiner

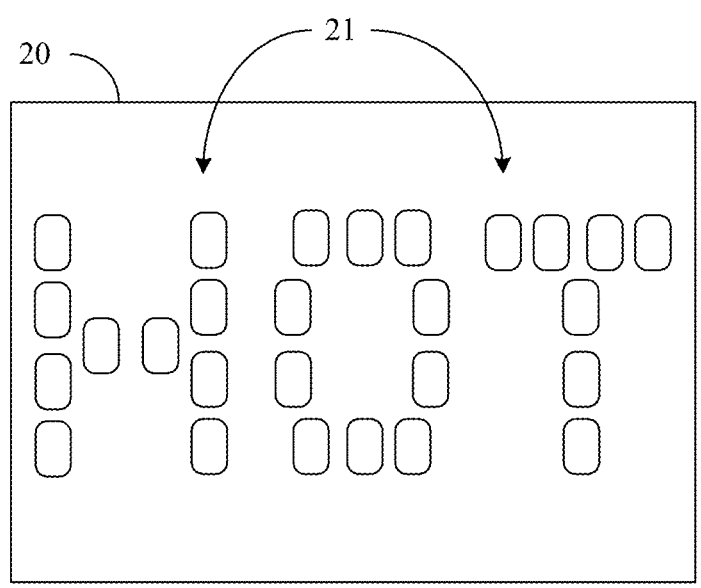
FIG. 3A  FIG. 3B

USER PROTECTION FROM THERMAL HOT SPOTS THROUGH DEVICE SKIN MORPHING

CROSS REFERENCE TO RELATED APPLICATIONS

This application is a U.S. National Phase Patent Application which claims benefit to International Patent Application No. PCT/US2016/024410 filed on Mar. 28, 2016.

TECHNICAL FIELD

Embodiments generally relate to the prevention of thermal related injuries. More particularly, embodiments relate to user protection from thermal hot spots through device skin morphing.

BACKGROUND

Electronic devices such as smart phones and tablet computers may generate heat during operation. The heat may be transferred to the skin (e.g., housing) of the electronic device in the form of "hot spots" located on the external surface of the skin, wherein the hot spots may potentially be harmful to the touch of a user. While conventional electronic devices may be designed to operate in a manner that prevents hot spots from occurring, such an approach may result in reduced performance.

BRIEF DESCRIPTION OF THE DRAWINGS

The various advantages of the embodiments will become apparent to one skilled in the art by reading the following specification and appended claims, and by referencing the following drawings, in which:

FIGS. 3A and 3B are side and front views, respectively, of an example of a plurality of opaque elastic regions arranged to form a message according to an embodiment;

DESCRIPTION OF EMBODIMENTS

Figure 1:
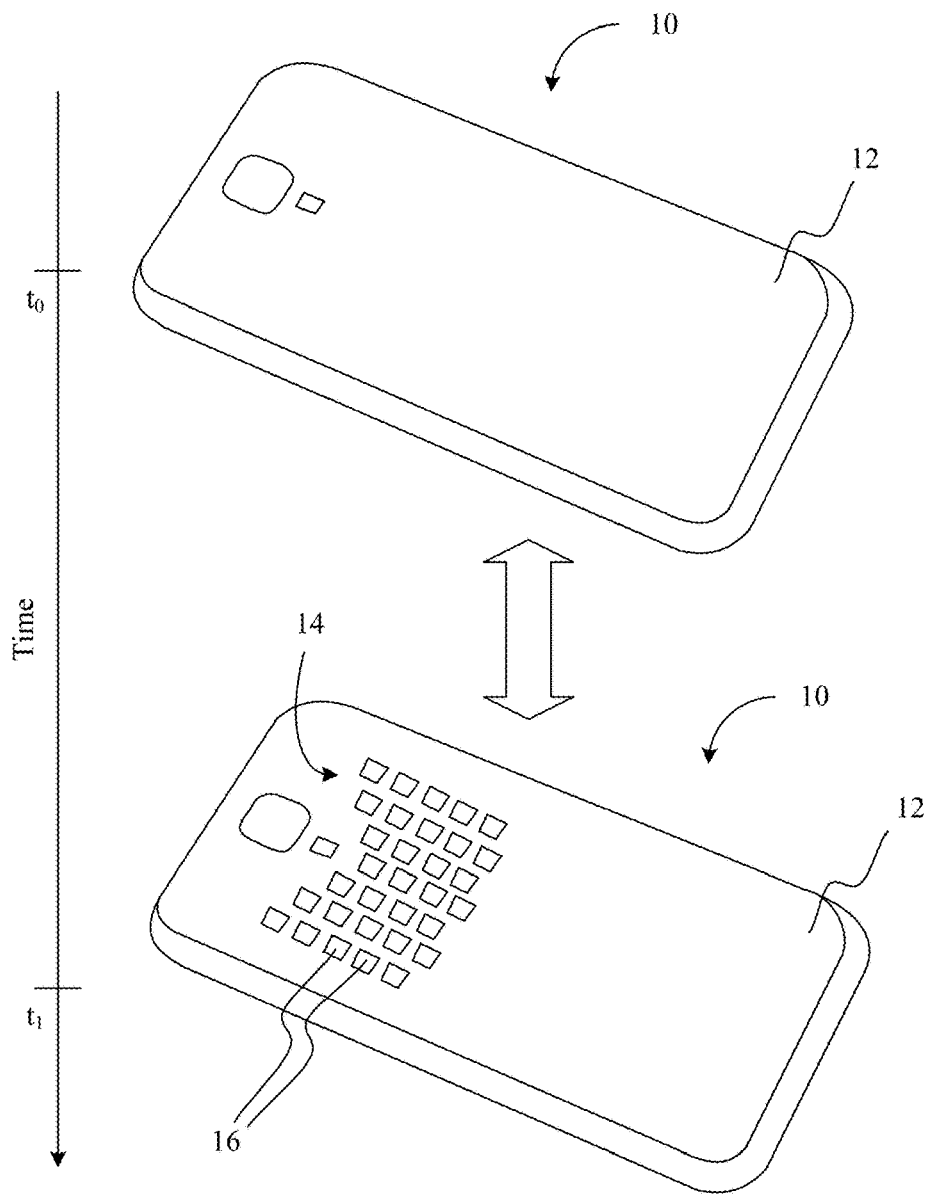
FIG. 1 is an external perspective view of an example of a user-based computing system that provides user protection from thermal hot spots through device skin morphing according to an embodiment.

Turning now to FIG. 1, a user-based computing system 10 is shown in which the system 10 may generate heat (e.g., from internal processors, memory subsystems, network controllers, etc.) during operation. Although the illustrated system 10 has a smart phone form factor, the system 10 may also be a tablet device, convertible tablet, notebook computer, media player, wearable device, personal digital assistant (PDA), mobile Internet device (MID), etc., or any combination thereof. In the illustrated example, a rear housing 12 (e.g., skin) of the system 10 is relatively cool in an initial state (e.g., at time $t_0$) due to, for example, non-operation (e.g., idleness) or operation of the system 10 in a relatively low performance state. At another moment in time, however, (e.g., at time $t_1$), at least a portion 14 of the rear housing 12 includes a hot spot due to, for example, operation of the system 10 in a relatively high performance state (e.g., game playing).

In order to provide user protection from the hot spot, the illustrated rear housing 12 automatically "morphs" to include protrusions 16 that provide a cooler alternative for the user to touch (e.g., with fingers, thumbs, etc.). As will be discussed in greater detail, a fluid having a relatively low thermal conductivity (e.g., less than approximately $10^{-2}$ W/(m*K)) may be pumped into the regions behind the protrusions 16. Accordingly, the illustrated system 10 provides enhanced user protection. The system 10 may also operate at higher performance levels (e.g., increased processor frequency and/or voltage levels) that may improve the user experience without concern over thermal related injury.

Figure 2:
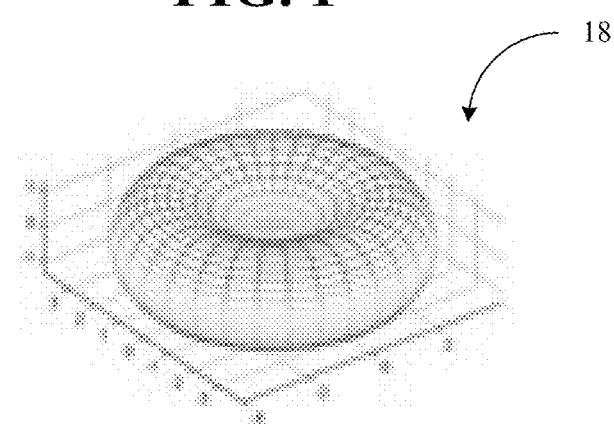
FIG. 2 is a perspective view of an example of a donut shaped opaque elastic region according to an embodiment.

FIG. 2 shows an alternative protrusion 18 that includes a donut shape. The illustrated protrusion 18 may increase the surface contact with the cooling medium (e.g., ambient air) while reducing the amount of fluid used to fill the protrusion 18. Other shapes may also be used depending on the circumstances.

FIGS. 3A and 3B show an outer layer 20 of a thermal protection apparatus, wherein the outer layer 20 includes a plurality of opaque elastic regions 21 that are arranged to form a message ("HOT"). Thus, when heat causes the regions 21 expand to become protrusions as shown, the user may be provided with both a cooler area to touch as well as a warning that the adjacent outer layer 20 includes a hot spot. Other messages, images and/or content may be conveyed via the regions 21 as appropriate.

Figure 4A:
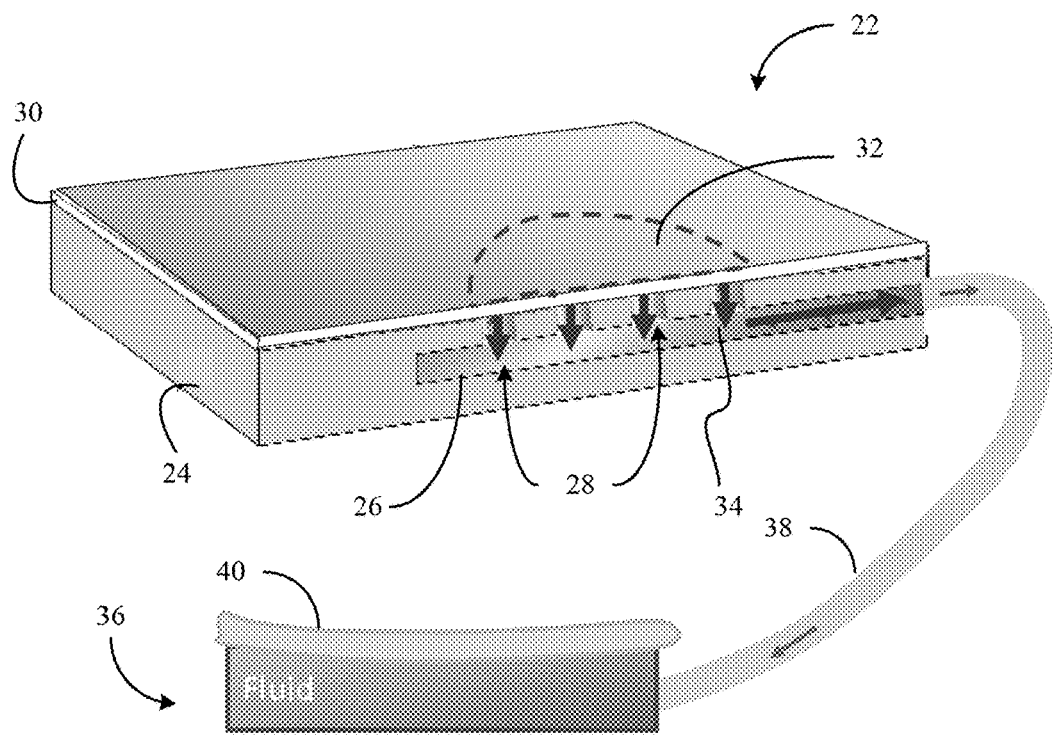
FIGS. 4A and 4B are illustrations of examples of a thermal protection apparatus in deactivated and activated states, respectively, according to an embodiment.
Figure 4B:
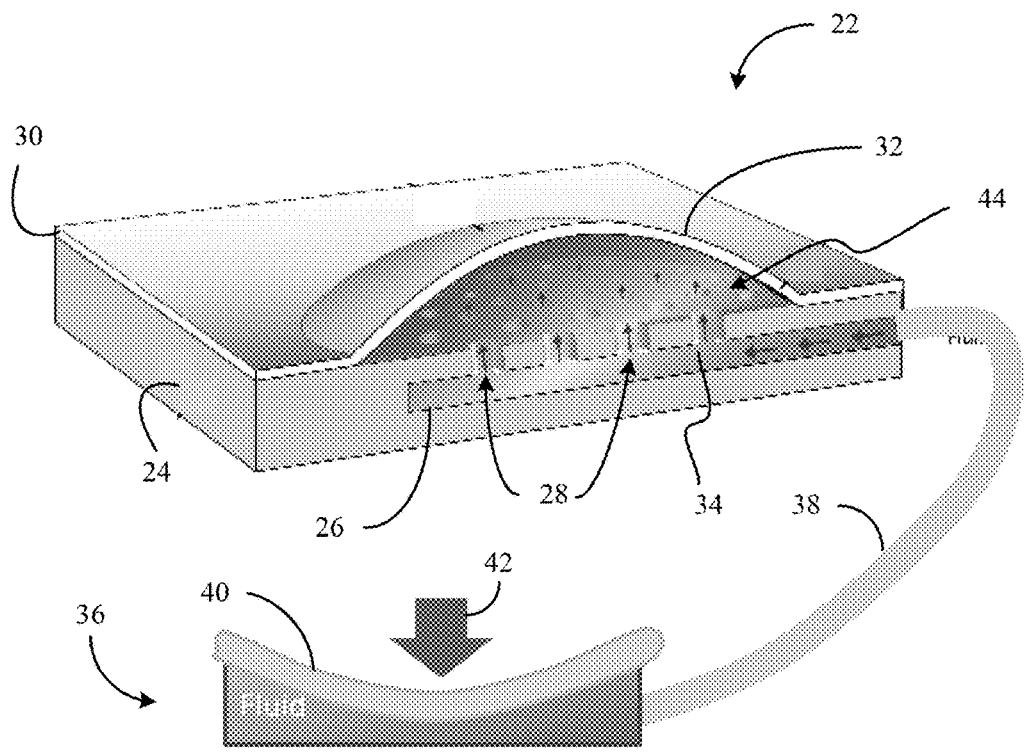

Turning now to FIGS. 4A and 4B, a thermal protection apparatus 22 is shown. The apparatus 22 may generally be incorporated into a user-based computing system such as, for example, the system 10 (FIG. 1) or any other touchable surface that may become hot. More particularly, the illustrated apparatus 22 includes a substrate 24 including surfaces defining one or more channels 26 and an array of openings 28 adjacent to the one or more channels 26. The apparatus 22 may also include an outer layer 30 coupled to the substrate 24, wherein the outer layer 30 includes an opaque elastic region 32 (e.g., including a non-transparent elastomer) positioned adjacent to the array of openings 28. Only a single opaque elastic region is shown to facilitate discussion, although a plurality of such regions may be used as in the examples shown in FIGS. 1, 3A and 3B.

Additionally, a fluid 34 may be positioned within the one or more channels 26. In one example, the fluid 34 has a relatively low thermal conductivity. For example, the fluid 34 might include SILICA AEROGEL, which has a thermal conductivity of less than approximately $10^{-2}$ W/(m*K) (e.g., less than the thermal conductivity of air). The fluid 34 may also have a relatively high viscosity (e.g., above a predetermined threshold that may be temperature dependent). A higher viscosity solution may be suitable due to the apparatus 22 having a relatively high latency tolerance. As already noted, the fluid 34 may cause the opaque elastic region 32 to expand into a protrusion (e.g., as shown in FIG. 4B), wherein the protrusion may have a wide variety of shapes (e.g., donut, rectangular, dome).

In the illustrated example, a reservoir 36 having a thermally responsive wall 40 (e.g., including a bimetal material) is coupled to a first end of a conduit 38 having a second end coupled to the one or more channels 26. Accordingly, heat 42 may cause a contraction of the thermally responsive wall 40 (e.g., as shown in FIG. 4B). The contraction of the thermally responsive wall 40 may in turn pump the fluid 34 through the conduit 38, the one or more channels 26 and the array of openings 28, and into an expansion area 44 between the opaque elastic region 32 and the substrate 24. By contrast, the absence of the heat 42 from the area surrounding the reservoir 36 may cause an expansion of the thermally responsive wall 40 (e.g., as shown in FIG. 4A). The expansion of the thermally responsive wall 40 may in turn draw the fluid 34 from the expansion area 44 and through the array of openings 28, the one or more channels 26 and the conduit 38. Accordingly, positioning the reservoir 36 adjacent to a heat source such as, for example, a processor, memory subsystem, etc. (not shown), may enable to the apparatus 22 to provide thermal protection without involving costly, heavy, large and/or power consuming components such as microcontrollers, pumps, actuation valves, and so forth. The conduit 38 may also include one or more miniature valves (not shown) to control the flow direction of the fluid 34.

Figure 5:
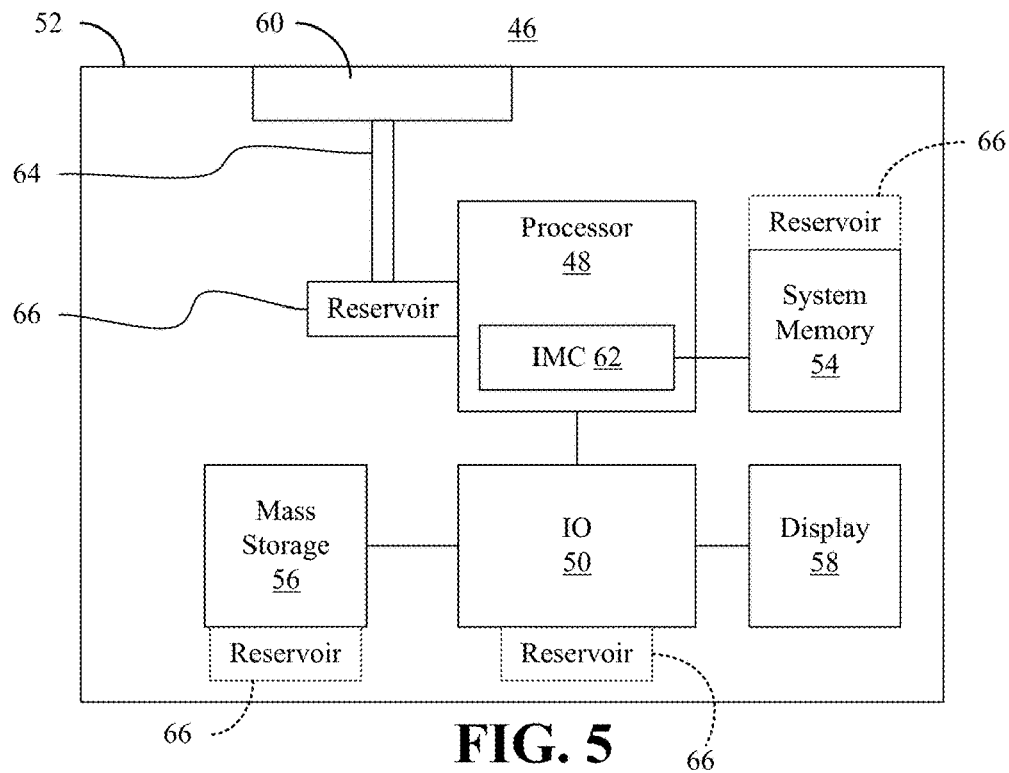
FIG. 5 is a block diagram of an example of a computing system according to an embodiment.

FIG. 5 shows a user-based computing system 46 in which one or more processors such as, for example a host processor 48 and an input/output (IO) unit 50 are positioned within a housing 52 (e.g., skin). The host processor 48 and the IO unit 50 may be incorporated onto a common semiconductor die (not shown) as a system on chip (SoC). The computing system 46 may also include a display 58 (e.g., embedded light emitting diode/LED and/or liquid crystal display/LCD) and a memory subsystem such as, for example, a system memory 54 (e.g., random access memory/RAM) and/or a mass storage 56 (e.g., hard disk drive/HDD, solid state disk/SSD, optical disk, flash memory). The host processor 48 may include an integrated memory controller (IMC) 62 that communicates with the system memory 54. Additionally, the IO unit 50 may function as a host device for the mass storage 56 and/or the display 58, which might be a touch screen positioned on a front of the system 46.

In the illustrated example, a thermal protection apparatus 60 is positioned near a potential hot spot on the housing 52. The thermal protection apparatus 60 may be similar to the apparatus 22 (FIGS. 4A and 4B). Therefore, the apparatus 60 may include a substrate having surfaces defining one or more channels and an array of openings adjacent to the one or more channels. The housing 52 may also include an outer layer coupled to the substrate, wherein the outer layer includes a plurality of opaque elastic regions adjacent to the array of openings. Moreover, a fluid may be positioned within the one or more channels.

Additionally, a conduit 64 may have a first end coupled to a reservoir 66 (e.g., elastic bladder) with a thermally responsive wall and a second end coupled to one or more channels of the apparatus 60. In such a case, contraction of the thermally responsive wall may pump the fluid through the array of openings and into a plurality of expansion areas between the opaque elastic regions and the substrate. Additionally, expansion of the thermally responsive wall may draw the fluid from the plurality of expansion areas and through the array of openings. Accordingly, positioning the reservoir 66 adjacent to a heat source such as, for example, the host processor 48, the mass storage 56, the 10 unit 50 and/or the system memory 54 may enable the apparatus 60 to provide thermal protection without involving costly, large and/or power consuming components such as microcontrollers, pumps, actuation valves, and so forth.

Figure 6:
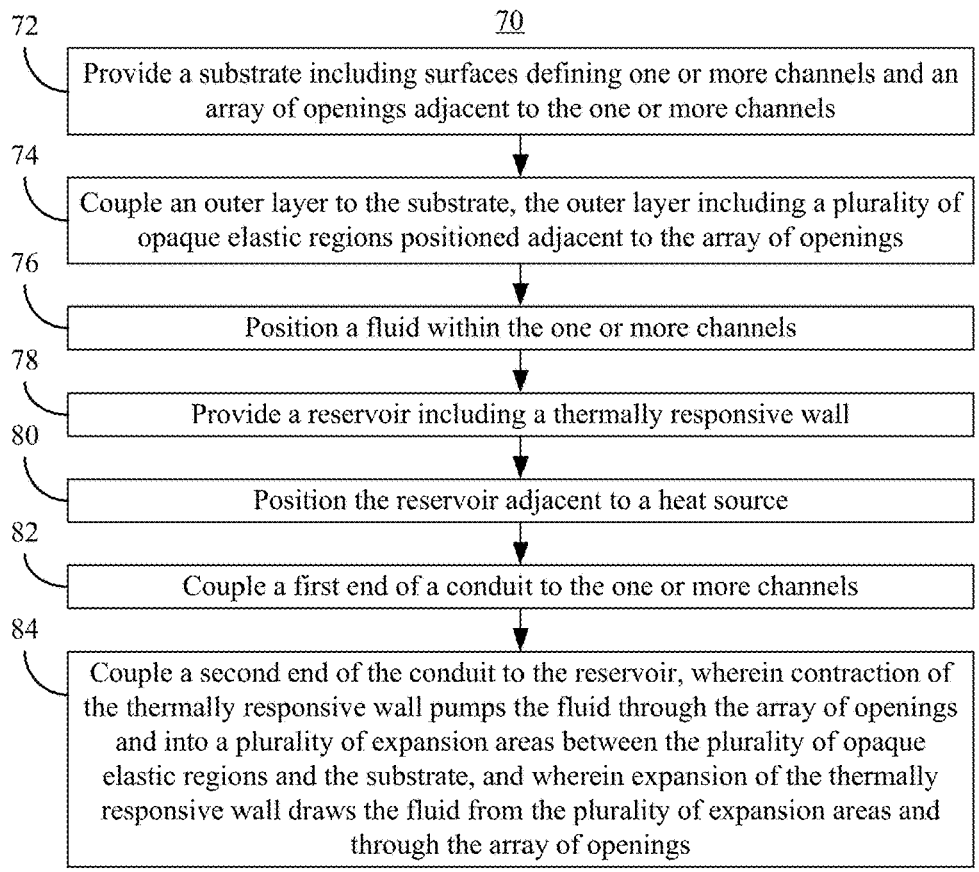
FIG. 6 is a flowchart of an example of a method of manufacturing a thermal protection apparatus according to an embodiment.

FIG. 6 shows a method 70 of manufacturing a thermal protection apparatus. The method 70 may generally be used to manufacture apparatuses such as, for example, the apparatus 22 (FIGS. 4A and 4B) and/or the apparatus 60 (FIG. 5), already discussed. More particularly, the method 70 may be implemented using one or more well-documented manufacturing technologies such as, for example, plastics forming, casting, metal stamping (e.g., progressive draw, deep draw), molding, assembly, and so forth. Illustrated processing block 72 provides a substrate including surfaces defining one or more channels and an array of openings adjacent to the one or more channels. Additionally, an outer layer may be coupled to the substrate at block 74, wherein the outer layer includes a plurality of opaque elastic regions positioned adjacent to the array of openings. Block 74 may optionally include arranging the plurality of opaque elastic regions to form a message. Block 76 may position a fluid within the one or more channels. As already noted, the fluid may have a relatively low thermal conductivity (e.g., less than approximately $10^{-2}$ W/(m*K)) and a relatively high viscosity (e.g., above a predetermined threshold that may be temperature dependent).

In one example, a reservoir including a thermally responsive wall is provided at block 78. The thermally responsive wall may include, for example, a bimetal or other suitable material. The reservoir may also be positioned adjacent to a heat source at block 80. Illustrated block 82 couples a first end of a conduit to the one or more channels, wherein a second end of the conduit may be coupled to the reservoir at block 84. In such a case, contraction of the thermally responsive wall may pump the fluid through the array of openings and into a plurality of expansion areas between the plurality of opaque elastic regions and the substrate. Additionally, expansion of the thermally responsive wall may draw the fluid from the plurality of expansion areas and through the array of openings. The order of operations shown in the method 70 may vary depending on the circumstances.

ADDITIONAL NOTES AND EXAMPLES

Example 1 may include a user-based computing system comprising a processor, a memory subsystem, a substrate including surfaces defining one or more channels and an array of openings adjacent to the one or more channels, a rear housing including an outer layer coupled to the substrate, the outer layer including a plurality of opaque elastic regions adjacent to the array of openings, a fluid positioned within the one or more channels, and an embedded display positioned on a front of the system.

Example 2 may include the system of Example 1, wherein the plurality of opaque elastic regions are expandable to become protrusions including one or more of a rectangular shape, a donut shape or a dome shape.

Example 3 may include the system of Example 1, wherein the plurality of opaque elastic regions are arranged to form a message.

Example 4 may include the system of Example 1, further including a reservoir including a thermally responsive wall, and a conduit having a first end coupled to the one or more channels and a second end coupled to the reservoir, wherein contraction of the thermally responsive wall pumps the fluid through the array of openings and into a plurality of expansion areas between the plurality of opaque elastic regions and the substrate, and wherein expansion of the thermally responsive wall draws the fluid from the plurality of expansion areas and through the array of openings.

Example 5 may include the system of Example 4, wherein the thermally responsive wall includes a bimetal material.

Example 6 may include the system of Example 4, wherein the reservoir is positioned adjacent to one or more of the processor or the memory subsystem.

Example 7 may include the system of any one of Examples 1 to 6, wherein the fluid has a thermal conductivity of less than approximately $10^{-2}$ W/(m*K).

Example 8 may include the system of any one of Examples 1 to 6, wherein the fluid has a viscosity that is above a predetermined threshold.

Example 9 may include a thermal protection apparatus comprising a substrate including surfaces defining one or more channels and an array of openings adjacent to the one or more channels, an outer layer coupled to the substrate, the outer layer including a plurality of opaque elastic regions positioned adjacent to the array of opening, and a fluid positioned within the one or more channels.

Example 10 the apparatus of Example 9, wherein the plurality of opaque elastic regions are expandable to become protrusions including one or more of a rectangular shape, a donut shape or a dome shape.

Example 11 may include the apparatus of Example 9, wherein the plurality of opaque elastic regions are arranged to form a message.

Example 12 may include the apparatus of Example 9, further including a reservoir including a thermally responsive wall, and a conduit having a first end coupled to the one or more channels and a second end coupled to the reservoir, wherein contraction of the thermally responsive wall pumps the fluid through the array of openings and into a plurality of expansion areas between the plurality of opaque elastic regions and the substrate, and wherein expansion of the thermally responsive wall draws the fluid from the plurality of expansion areas and through the array of openings.

Example 13 may include the apparatus of Example 12, wherein the thermally responsive wall includes a bimetal material.

Example 14 may include the apparatus of Example 12, wherein the reservoir is positioned adjacent to a heat source.

Example 15 may include the apparatus of any one of Examples 9 to 14, wherein the fluid has a thermal conductivity of less than approximately $10^{-2}$ W/(m*K).

Example 16 may include the apparatus of any one of Examples 9 to 14, wherein the fluid has a viscosity that is above a predetermined threshold.

Example 17 may include a method of manufacturing a thermal protection apparatus, comprising providing a substrate including surfaces defining one or more channels and an array of openings adjacent to the one or more channels, coupling an outer layer to the substrate, the outer layer including a plurality of opaque elastic regions positioned adjacent to the array of openings, and positioning a fluid within the one or more channels.

Example 18 may include the method of Example 17, wherein the plurality of opaque elastic regions are expandable to become one or more of a rectangular shape, a donut shape or a dome shape.

Example 19 may include the method of Example 17, further including arranging the plurality of opaque elastic regions to form a message.

Example 20 may include the method of Example 17, further including providing a reservoir including a thermally responsive wall, coupling a first end of a conduit to the one or more channels, and coupling a second end of the conduit to the reservoir, wherein contraction of the thermally responsive wall pumps the fluid through the array of openings and into a plurality of expansion areas between the plurality of opaque elastic regions and the substrate, and wherein expansion of the thermally responsive wall draws the fluid from the plurality of expansion areas and through the array of openings.

Example 21 may include the method of Example 20, wherein the thermally responsive wall includes a bimetal material.

Example 22 may include the method of Example 20, further including positioning the reservoir adjacent to a heat source.

Example 23 may include the method of any one of Examples 17 to 22, wherein the fluid has a thermal conductivity of less than approximately $10^{-2}$ W/(m*K).

Example 24 may include the method of any one of Examples 17 to 22, wherein the fluid has a viscosity that is above a predetermined threshold.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A system, comprising:
    a processor;
    a memory subsystem;
    a substrate including surfaces defining one or more channels and an array of openings adjacent to the one or more channels;
    a rear housing including an outer layer coupled to the substrate, the outer layer including a plurality of opaque elastic regions adjacent to the array of openings;
    a reservoir for a fluid, the reservoir including a thermally responsive wall; and
    a conduit having a first end coupled to the one or more channels and a second end coupled to the reservoir, wherein contraction of the thermally responsive wall pumps the fluid from the reservoir through the array of openings and into a plurality of expansion areas between the plurality of opaque elastic regions and the substrate, and wherein expansion of the thermally responsive wall draws the fluid from the plurality of expansion areas and through the array of openings.

2. The system of claim 1, wherein the plurality of opaque elastic regions are expandable to become protrusions including one or more of a rectangular shape, a donut shape or a dome shape.

3. The system of claim 1, wherein the plurality of opaque elastic regions are arranged to form a message.

4. The system of claim 1, wherein the thermally responsive wall includes a bimetal material.

5. The system of claim 1, wherein the reservoir is positioned adjacent to one or more of the processor or the memory subsystem.

6. The system of claim 1, wherein the fluid has a thermal conductivity of less than approximately $10^{-2}$ W/(m*K).

7. The system of claim 1, wherein the fluid has a viscosity that is above a predetermined threshold.

8. An apparatus comprising:
    a substrate including surfaces defining one or more channels and an array of openings adjacent to the one or more channels;
    an outer layer coupled to the substrate, the outer layer including a plurality of opaque elastic regions positioned adjacent to the array of openings;
    a reservoir for a fluid, the reservoir including a thermally responsive wall; and
    a conduit having a first end coupled to the one or more channels and a second end coupled to the reservoir, wherein contraction of the thermally responsive wall pumps the fluid from the reservoir through the array of openings and into a plurality of expansion areas between the plurality of opaque elastic regions and the substrate, and wherein expansion of the thermally responsive wall draws the fluid from the plurality of expansion areas and through the array of openings.

9. The apparatus of claim 8, wherein the plurality of opaque elastic regions are expandable to become protrusions including one or more of a rectangular shape, a donut shape or a dome shape.

10. The apparatus of claim 8, wherein the plurality of opaque elastic regions are arranged to form a message.

11. The apparatus of claim 8, wherein the thermally responsive wall includes a bimetal material.

12. The apparatus of claim 8, wherein the reservoir is positioned adjacent to a heat source.

13. The apparatus of claim 8, wherein the fluid has a thermal conductivity of less than approximately $10^{-2}$ W/(m*K).

14. The apparatus of claim 8, wherein the fluid has a viscosity that is above a predetermined threshold.

15. A method of manufacturing a thermal protection apparatus, the method comprising:
    providing a substrate including surfaces defining one or more channels and an array of openings adjacent to the one or more channels, and a reservoir for a fluid, the reservoir including a thermally responsive wall;
    coupling an outer layer to the substrate, the outer layer including a plurality of opaque elastic regions positioned adjacent to the array of openings;
    coupling a first end of a conduit to the one or more channels and a second end of the conduit to the reservoir, wherein contraction of the thermally responsive wall pumps the fluid from the reservoir through the array of openings and into a plurality of expansion areas between the plurality of opaque elastic regions and the substrate, and wherein expansion of the thermally responsive wall draws the fluid from the plurality of expansion areas and through the array of openings.

16. The method of claim 15, wherein the plurality of opaque elastic regions are expandable to become one or more of a rectangular shape, a donut shape or a dome shape.

17. The method of claim 15, further including arranging the plurality of opaque elastic regions to form a message.

18. The method of claim 15, wherein the thermally responsive wall includes a bimetal material.

19. The method of claim 15, further including positioning the reservoir adjacent to a heat source.

20. The method of claim 15, wherein the fluid has a thermal conductivity of less than approximately $10^{-2}$ W/(m*K).

21. The method of claim 15, wherein the fluid has a viscosity that is above a predetermined threshold.

* * * * *